(12) United States Patent
Yamamoto

(10) Patent No.: US 6,437,402 B1
(45) Date of Patent: Aug. 20, 2002

(54) POWER MOS TRANSISTOR

(75) Inventor: Seiichi Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/657,303

(22) Filed: Sep. 7, 2000

(30) Foreign Application Priority Data

Sep. 8, 1999 (JP) ............................................ 11-253758

(51) Int. Cl.[7] .......................... H01L 29/76; H01L 29/94; H01L 31/062; H01L 31/113; H01L 31/119
(52) U.S. Cl. .......................... 257/342; 257/341; 257/343
(58) Field of Search .......................... 257/202–211, 341, 257/342, 343, 346, 401; 438/284–286, 299

(56) References Cited

U.S. PATENT DOCUMENTS 5,442,218 A * 8/1995 Seidel et al. ................. 257/369
5,852,318 A * 12/1998 Chikamatsu et al. ........ 257/390
5,859,456 A * 1/1999 Efland et al. ................ 257/335

FOREIGN PATENT DOCUMENTS

JP          410242463 A  *  9/1998   ........... H01L/29/78

* cited by examiner

Primary Examiner—Nathan Flynn
Assistant Examiner—Johannes P Mondt
(74) Attorney, Agent, or Firm—Hogan & Hartson, LLP

(57) ABSTRACT

A power MOS transistor including a multiplicity of MOS transistor cells in first and a second power MOS block. The first power MOS block includes a first half of the MOS transistor cells and is equipped with a first set of source leads and drain leads for connecting in parallel the first half of the MOS transistor cells. The second power MOS block includes a second half of the MOS transistor cells and is equipped with a second set of source leads and drain leads for connecting in parallel the second half of the MOS transistor cells. The first set of source leads protrude along one direction of the first power MOS block and form a first source protruding section. The first set of drain leads protrude along an opposite direction of the first power MOS block and form a first drain protruding section. The second set of source leads protrude along one direction of the second power MOS block and form a second source protruding section. The second set of drain leads protrude along an opposite direction of the second power MOS block and form a second drain protruding section.

2 Claims, 3 Drawing Sheets

POWER MOS TRANSISTOR

FIELD OF THE INVENTION

The invention relates to a power MOS transistor for use as a driving stage, such as a pulse generating driver and a switching regulator, for driving a load, and more particularly, to a power MOS transistor comprising a multiplicity of combined MOS transistor cells.

BACKGROUND OF THE INVENTION

A high power MOS transistor is used in pulse generating drive circuits such as a CD driver and a DVD driver and in a switching regulator to drive actuators and motors.

A typical high power MOS transistor includes a multiplicity of MOS transistor cells formed on a semiconductor substrate and connected in parallel with one another. FIGS. 1A and 1B show an arrangement of such MOS transistor cells and lead wires therefor in a power MOS transistor.

As shown in FIG. 1A, the power MOS transistor cells are formed on a semiconductor substrate having a definite conduction type (which is hereinafter assumed to be p-type). Each MOS transistor cell 11 has a square configuration of 19 $\mu$m×19 $\mu$m for example. Formed at the center of each MOS transistor cell 11 is a source contact 13 to be connected with an n-type source region of the cell. The source contact 13 is surrounded by four drain contacts 14 located at the four corners of the cell, which are connected with respective n-type drain region of the cell.

A meshed gate 12 is formed over the semiconductor substrate via a insulating oxide layer such that the four nodes of each mesh are located on the four sides of the cell, as shown in the figure.

The gate 12 has a p-type layer that underlies the meshes, n-type regions adjacent the drain contacts 14 to serve as drains, and n-type regions adjacent the source contacts 13 to serve as sources. This arrangement can be attained through a self-alignment technique in which gates are used as masks while forming sources and drains by ion injection. Formed on and connected to the back side of the semiconductor substrate are back gate contacts 15.

Aluminum source leads 16 extend over and across the gate 12 in the horizontal direction as shown in FIG. 1B, so that they connect together the source contacts 13 of the MOS transistor cells 11 lying below the source leads 16. Also, aluminum drain leads 17 extend over and across the gate 12 in the horizontal direction as shown in the figure, so that they connect together the drain contacts 14 of the respective MOS transistor cells 11 lying below the drain leads 17.

Since all the gates 12 of the MOS transistor cells 11 are connected together, they have the same electric potential. Similarly, all the aluminum source leads 16 are connected together to have the same electric potential, and so are the aluminum drain leads 17 to have the same potential. Of course all the back gate contacts 15 of the MOS transistor cells 11 are connected together to have the same electric potential.

These MOS transistor cells 11 are formed on the same monolithic semiconductor count 2000 in total in a rectangular matrix of 40 by 50 cells for example to constitute a giant power MOS transistor. FIG. 2 shows an arrangement of such numerous MOS transistor cells connected to form a conventional power MOS transistor 20 as mentioned above.

In FIG. 2, an assembly or rows and columns of a multiplicity of MOS transistor cells form a power MOS block B. The matrix shaped gates 22 derived from the power MOS block B are connected to the gate leads 221 extending around the block B. The gate leads 221 are provided for connection with the internal circuits of the power MOS transistor 20. The gate leads 221 may be made of polysilicon since they do not require a large current capacity.

Aluminum source leads 26 are derived from the power MOS block B to the left of the block for connection with the aluminum source extension leads 261, which are connected with a common source pad 262. These aluminum source leads 26, aluminum source extension leads 261 and source pad 262 are formed from the same aluminum layer so that they are connected together. The aluminum drain leads 27 are derived from the power MOS block B to the right of the block B for connection with the aluminum drain extension leads 271, which are connected to a common drain pad 272. These aluminum drain leads 27, aluminum drain extension leads 271 and drain pad 272 are formed from the same aluminum layer so that they are connected together.

The power MOS transistor 20 thus formed of many MOS transistor cells has a large capacity and performs switching operations in just the same manner as an ordinary MOS transistor.

In such a conventional power MOS transistor 20 consisting of many combined MOS transistor cells, aluminum source leads 26 and aluminum drain leads 27 are extended out of the block B and connected to an aluminum source extension lead 261 and to an aluminum drain extension lead 271, respectively, which extension leads 261 and 2.71 are in turn connected to a source pad 262 and a drain pad 272, respectively.

The aluminum source extension leads 261 and the aluminum drain extension leads 271 must have sufficiently large conduction areas so that the power MOS transistor 20 has a desired low ON-state resistance, allowing a required current density for the power MOS transistor 20. The dimensions of the aluminum source extension leads 261 and the aluminum drain extension leads 271 are determined to meet the requirement.

Consequently, it is difficult for a conventional power MOS transistor 20 to harmonize two requirements that the ON-state resistance of a power MOS transistor 20 be reduced for an improvement of the current density by enlarging the leads, and that the chip size be minimized for economy of cost.

SUMMARY OF THE INVENTION

In accordance with the invention, a power MOS transistor including a multiplicity of MOS transistor cells formed on a semiconductor substrate and connected in parallel. The power MOS transistor includes a first power MOS block and a second power MOS block. The first power MOS block includes a first half of the MOS transistor cells and is equipped with a first set of source leads and a first set of drain leads for connecting in parallel the first half of the MOS transistor cells. The second power MOS block includes a second half of the MOS transistor cells and is equipped with a second set of source leads and a second set of drain leads for connecting in parallel the second half of the MOS transistor cells.

A planar source extension lead is formed on the upper surface of the first power MOS block. A planar drain extension lead is formed on the upper surface of the second power MOS block. The first set of source leads of the first power MOS block and the second set of source leads of the second power MOS block are connected with the planar source extension lead, while the first set of drain leads of the first power MOS block and the second set of drain leads of the second power MOS block are connected with the planar drain extension lead. The first power MOS block and the second power MOS block are disposed beside each other.

The first and the second sets of source leads and the first and the second sets of drain leads of the first and the second power MOS blocks are formed to extend in one direction. The first set of source leads of the first power MOS block are connected to the planar source extension lead at one side of the planar source extension lead, and the second set of source leads of the second power MOS block are connected to another side of the planar source extension lead. The first set of drain leads of the first power MOS block are connected to the planar drain extension lead at one side of the planar drain extension lead, and the second set of drain leads of the second power MOS block are connected to another side of the planar drain extension lead.

The first set of source leads of the first power MOS block protrude along one direction of the first power MOS block and form a first source protruding section. The first set of drain leads protrude along an opposite direction of the first power MOS block and form a first drain protruding section. The second set of source leads of the second power MOS block protrude along one direction of the second power MOS block and form a second source protruding section. The second set of drain leads protrude along an opposite direction of the second power MOS block and form a second drain protruding section.

The planar source extension lead and the planar drain extension lead are disposed beside each other across an insulation gap, and have, across the insulation gap, respective edges having square tooth-recess profile sections such that teeth of one respective edge fit recesses of the other respective edge. The first and the second source protruding sections of the source leads are connected to the square tooth-recess profile section of the planar source extension lead. The first and the second drain protruding sections of the drain leads are connected to the square tooth-recess profile section of the planar drain extension lead.

In the power MOS transistor, the first and the second sets of source leads and the first and the second sets of drain leads of the first and the second power MOS blocks are formed simultaneously during the same fabrication process in a first metallic layer. The planar source extension lead and the planar drain extension lead are formed simultaneously during the same fabrication process in a second metallic layer.

Unlike conventional power MOS transistors, a power MOS transistor of the invention has a multiplicity of MOS transistor cells divided into two blocks with one block having on the upper surface thereof planar source extension leads and the other block having on the upper surface thereof planar drain extension leads, thereby requiring no dedicated lead regions for the sources and the drains. This helps improve area-efficiency of the power MOS transistor.

The widths of the planar source extension lead and the planar drain extension lead may be broaden to meet a power requirement of the power MOS blocks, which enables reduction of ON-resistances of the blocks, and resulting in almost negligible voltage drops across the blocks.

Because the multiple MOS transistor cells are grouped into two blocks, length of the source leads and the drain leads in each block can be short to further reduce the voltage drop caused by the leads.

The source leads of each block extend in one direction beyond the block and the drain leads in the opposite direction beyond the block. The planar source extension lead and the planar drain extension lead (made of a second metallic layer) together have a pair of square tooth-recess profiles along the neighboring edges of the blocks, such that the teeth of the profile of one block face the recesses of the profile of the other block. As a result, the source leads and the drain leads of one block can be easily connected with the respective source leads and the drain leads of the other block by means of the planar source extension lead and the planar drain extension lead.

DETAILED DESCRIPTION OF THE PREFERRED EMBODIMENT

Referring now to FIG. 3, there is shown a power MOS transistor according to the invention, in which a multiplicity of MOS transistor cells are formed on a monolithic semiconductor substrate aligned in rows and columns and connected in parallel to form a power MOS transistor.

Figure 3A:
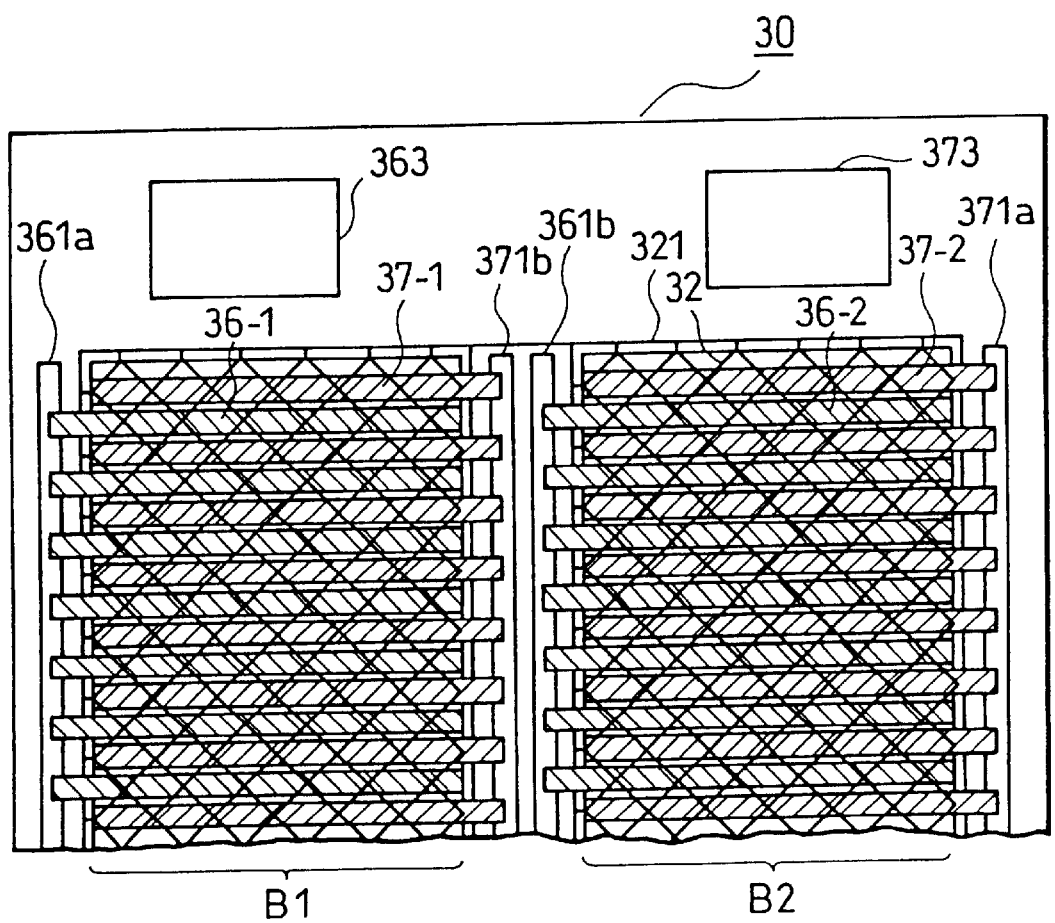
FIG. 3 illustrates an arrangement of a power MOS transistor according to the invention.
Figure 3B:
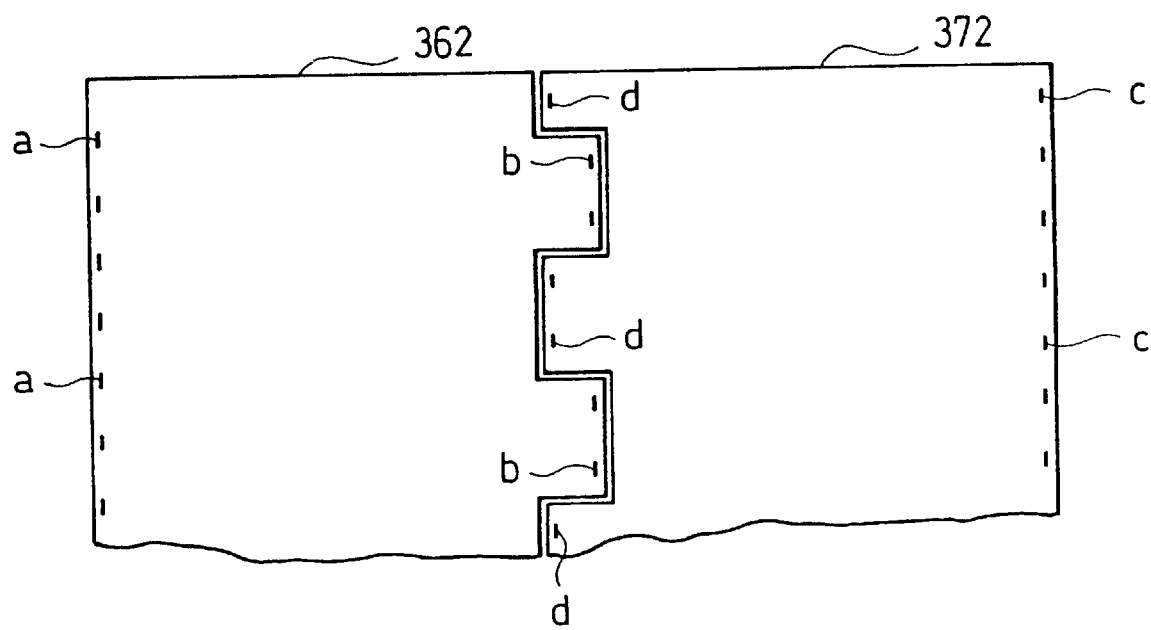

FIG. 3A shows a power MOS transistor 30, with a planar source extension lead 362 and a planar drain extension lead 372 removed for simplicity. FIG. 3B shows the planar source extension lead 362 and the planar drain extension lead 372.

As shown in FIG. 3A, the MOS transistor cells of the power MOS transistor 30 is divided into a first and a second power MOS blocks B1 and B2, respectively.

Figure 1A:
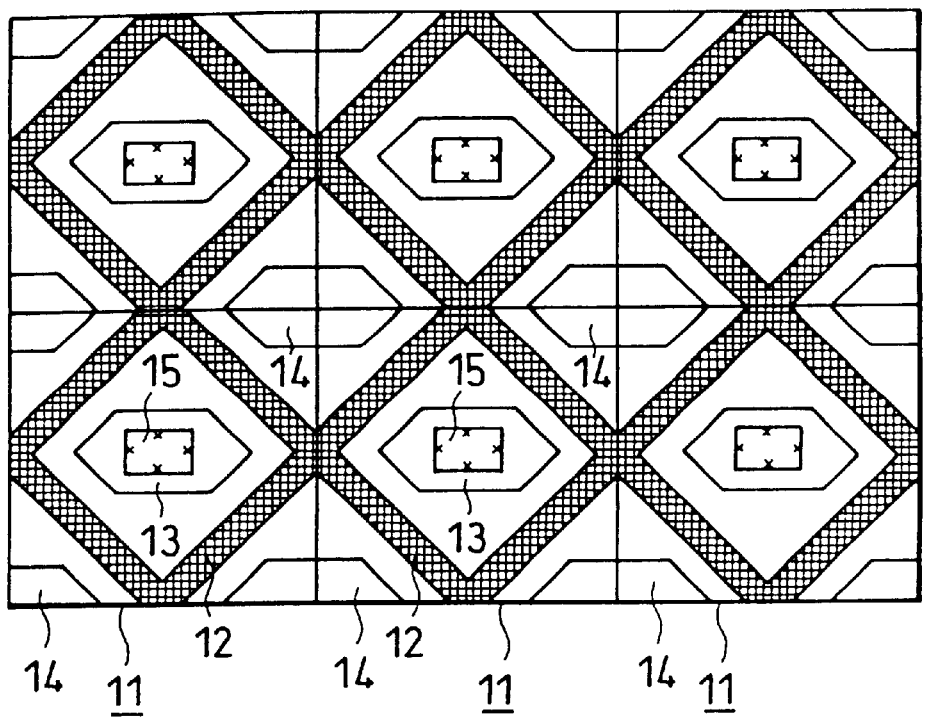
FIG. 1 illustrates arrangement of MOS transistor cells of a power MOS transistor, also showing connections of the cells (Prior Art).
Figure 1B:
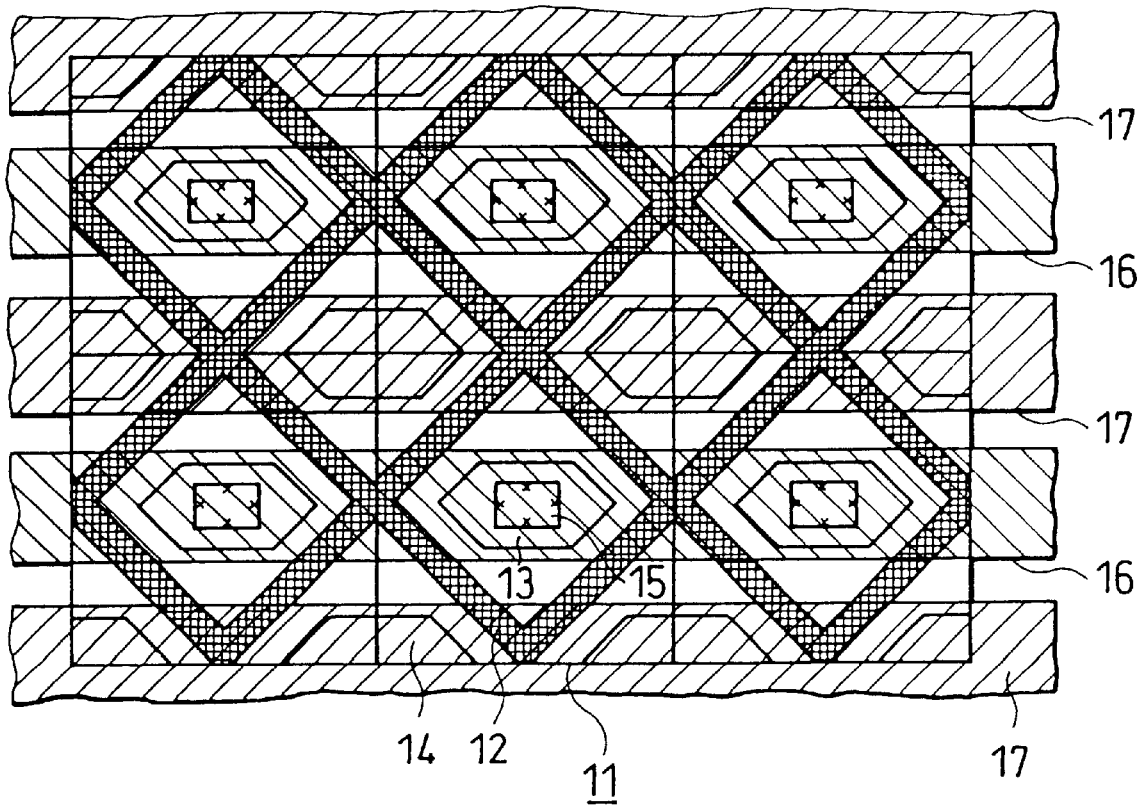
Figure 2:
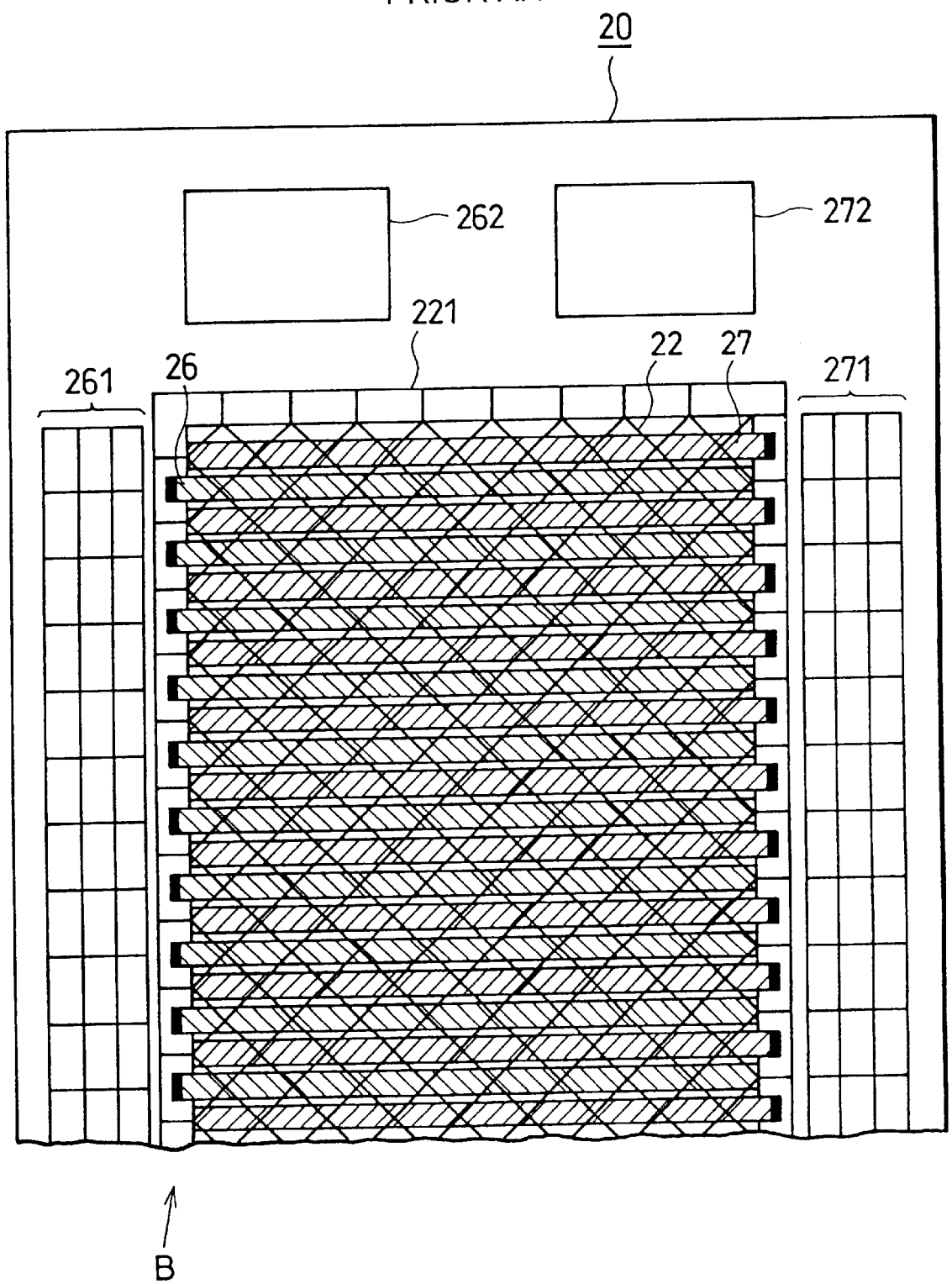
FIG. 2 illustrates an arrangement of a conventional power MOS transistor (Prior Art).

The first power MOS block B1 includes a first multiplicity of MOS transistor cells arranged as shown in FIG. 1, the source contacts of the cells are connected together by a first set of horizontal aluminum source leads 36-1, and the drain contacts of the cells are connected together by a first set of horizontal aluminum drain leads 37-1. The source leads 36-1 and the drain leads 37-1 alternate with each other on the substrate. In the example shown herein, the first set of aluminum source leads 36-1 protrude to the left of the block B1, while the first set of aluminum drain leads 37-1 protrude to the right of the block B1.

Similarly, in the second power MOS block B2, a second multiplicity of MOS transistor cells are also arranged as shown in FIG. 1, the second source contacts of the cells are connected together by a second set of horizontal aluminum source leads 36-2, and the second drain contacts of the cells are connected together by a second set of horizontal aluminum drain leads 37-2, both aluminum leads extending in the same direction as the corresponding aluminum leads in the power MOS block B1. That is, the second set of aluminum source leads 36-2 protrude to the left and the second set of aluminum drain leads 37-2 protrude to the right.

A first source lead connection member 361a is provided to connect the first set of aluminum source leads 36-1 of the first power MOS block B1 with external devices, and so is a second source lead connection member 361b to connect the second set of aluminum source leads 36-2 of the second power MOS block B2 with external devices. A first drain lead connection member 371b is provided to connect the first set of aluminum drain leads 37-1 of the first power MOS block B1 with external devices, and so is a second drain lead connection member 371a to connect the second set of aluminum drain leads 37-2 of the second power MOS block B2 with external devices.

A source pad 363 is provided to serve as a terminal for connection of the source of the power MOS transistor 30 with external devices. A drain pad 373 is provided to serve as a terminal for connection of the drain of the power MOS transistor 30 with external devices.

The gate 32 of the power MOS transistor 30 is connected with a gate lead 321 extending around the first and the second power MOS blocks B1 and B2, respectively. The gate lead 321 is connected with the internal circuitry (not shown) of the power MOS transistor 30.

In the example shown herein, the first and the second sets of aluminum source leads 36-1 and 36-2, respectively, are connected with the first and the second source lead connection members 361a and 361b, respectively, and the first and the second sets of aluminum drain leads 37-1 and 37-2, respectively, are connected with the first and the second drain lead connection members 371a and 371b, respectively.

However, in actuality, all the aluminum leads 36-1, 36-2, 37-1 and 37-2 as well as all the lead connection members 361a, 361b, 371a and 371b are formed simultaneously in the same fabrication process along with the source pad 363 and the drain pad 373. Thus, the aluminum leads 36-1, 36-2, 37-1 and 37-2 and the lead connection members 361a, 361b, 371a and 371b are formed integral with one another.

FIG. 3B shows the planar source extension lead 362 with the planar drain extension lead 372. The planar source extension lead 362 is formed on the upper surface of the first power MOS block B1 with an insulating layer in between them. The planar drain extension lead 372 is formed on the upper surface of the second power MOS block B2 with an insulating layer in between them. The planar source extension lead 362 and the planar drain extension lead 372 are fabricated in a second aluminum layer on the substrate simultaneously with the source pad 363 and the drain pad 373.

The source pad 363 and the drain pad 373 may be fabricated using the second aluminum layer formed on the corresponding first aluminum layer by removing a protective glass film on the second aluminum layer. Thus, the resistance between source pad 363 and the planar source extension lead 362 is extremely small. Similarly, the resistance between the drain pad 373 and the planar drain extension lead 372 is also extremely small.

In order to allow the planar source extension lead 362 to be connected with every one of the source leads 36-1 and 36-2. respectively, of the first and the second power MOS blocks B1 and B2, respectively, and to allow the planar drain extension lead 372 to be connected with every one of the drain leads 37-1 and 37-2, respectively, of the first and the second power MOS blocks B1 and B2, respectively, the planar source extension lead 362 and the planar drain extension lead 372 are each formed to have a square tooth-recess profile along the neighboring edges such that the teeth of one profile face the recesses of the other profile across an insulating gap, as shown in FIG. 3B.

It is noted that the planar source extension lead 362 formed on, but insulated from, the upper surface of the first power MOS block B1 is connected, at the left end thereof (as marked "a" in FIG. 3B), with the first aluminum source leads 36-1 that extend to the left of the first power MOS block B1 by means of the source lead connection member 361a, and is further connected, at the right end thereof (as marked "b" in FIG. 3B), with the second aluminum source leads 36-2 that extend to the left of the second power MOS block B2 by means of the source lead connection member 361b.

In this manner, the planar source extension lead 362 is connected with every aluminum source leads 36-1 and 36-2 of the first and the second power MOS blocks B1 and B2, respectively. The planar source extension lead 362 is further connected with the source pad 363 for external connection thereof.

It should be appreciated that the planar source extension lead 362 can be formed over the entire first power MOS block B1 and have a very large area for passing electrical current therethrough, thereby making the resistance thereof negligibly small. In addition, the source leads of each power MOS block are divided into two shorter sets of aluminum source leads 36-1 and 36-2, so that the voltage drops due to the source leads are reduced accordingly.

Similarly, the planar drain extension lead 372 formed on, but insulated from, the upper surface of the second power MOS block B2 is connected, at the left end thereof (as marked "d" in FIG. 3B), with the first aluminum drain leads 37-1 that extend to the right of the power MOS block B1 by means of the drain lead connection member 371b, and is further connected, at the right end thereof (as marked "c" in FIG. 3B),with the second aluminum drain lead 37-2 that extend to the right of the second power MOS block B2 by means of the drain lead connection member 371a.

Thus, the planar drain extension lead 372 is connected with every aluminum drain lead 37-1 and 37-2 of the first and the second power MOS blocks B1 and B2, respectively. The planar drain extension lead 372 is further connected with the drain pad 373 for external connection thereof.

It should be appreciated that the area for passing electric current through the planar drain extension lead 372 can be large enough to make the electric resistance thereof negligibly small, since the planar drain extension lead 372 can be formed large enough to overlap the entire second power MOS block B2. In addition, the drain leads of the MOS blocks are divided into two shorter sets of aluminum drain leads 37-1 and 37-2 for the respective blocks, so that the voltage drops due to the drain leads are reduced accordingly.

It is recalled that in the invention a multiplicity of MOS transistor cells forming a power MOS transistor are divided into two blocks B1 and B2 such that the first power MOS block B1 has a planar source extension lead 362 formed on the upper surface of the block B1, and the second power MOS block B2 has a planar drain extension lead 372 formed on the upper surface of the block B2. Thus, the power MOS transistor of the invention has improved conductive areas for the source and the drain, without providing any dedicated source leads and drain leads as in conventional power MOS transistor.

The widths of the planar source extension lead 362 and the planar drain extension lead 372 may be broaden to meet a power requirement of the power MOS blocks, enabling ON-resistances of the blocks to be reduced, and resulting in almost negligible voltage drops across the blocks. The division of the multiple MOS transistor cells into two blocks B1 and B2 results in shorter lengths of the source leads and the drain leads in each block, which contributes to further reduction of the voltage drop caused by the leads.

A comparison of the ON-state resistance of a power MOS transistor of the invention with a typical prior art power MOS transistor manifests an improvement by the invention that the ratio of the former to the latter is only 0.83, that is, the resistance is reduced by 17%.

Although the planar source extension lead 362 and the planar drain extension lead 372 are shown in the above examples to extend over the entire region of the respective power MOS blocks, it would be clear to those skilled in the art that the planar source extension lead 362 and the planar drain extension lead 372 may have a smaller area if the current requirement imposed on the power MOS transistor is not critical.

It would be also clear that any appropriate metallic material can be used in of aluminum for the conductive leads and layers.

I claim:

1. A power MOS transistor including a multiplicity of MOS transistor cells formed on a semiconductor substrate and connected in parallel, said power MOS transistor comprising:

a first power MOS block including a first half of said MOS transistor cells and equipped with a first set of source leads and a first set of drain leads for connecting in parallel said first half of said MOS transistor cells;

a second power MOS block including a second half of said MOS transistor cells and equipped with a second set of source leads and a second set of drain leads for connecting in parallel said second half of said MOS transistor cells;

a planar source extension lead formed on the upper surface of said first power MOS block;

a planar drain extension lead formed on the upper surface of said second power MOS block, wherein said first set of source leads of said first power MOS block and said second set of source leads of said second power MOS block are connected with said planar source extension lead, while said first set of drain leads of said first power MOS block and said second set of drain leads of said second power MOS block are connected with said planar drain extension lead;

said first power MOS block and said second power MOS block are disposed beside each other;

said first and said second sets of source leads and said first and said second sets of drain leads of said first and said second power MOS blocks are formed to extend in one direction;

said first set of source leads of said first power MOS block are connected to said planar source extension lead at one side of said planar source extension lead, and said second set of source leads of said second power MOS block are connected to another side of said planar source extension lead;

said first set of drain leads of said first power MOS block are connected to said planar drain extension lead at one side of said planar drain extension lead, and said second set of drain leads of said second power MOS block are connected to another side of said planar drain extension lead;

said first set of source leads of said first power MOS block protrude along one direction of said first power MOS block and form a first source protruding section, and said first set of drain leads protrude along an opposite direction of said first power MOS block and form a first drain protruding section;

said second set of source leads of said second power MOS block protrude along one direction of said second power MOS block and form a second source protruding section, and said second set of drain leads protrude along an opposite direction of said second power MOS block and form a second drain protruding section;

said planar source extension lead and said planar drain extension lead are disposed beside each other across an insulation gap, and have, across said insulation gap, respective edges having square tooth-recess profile sections such that teeth of one respective edge fit recesses of the other respective edge; and said first and said second source protruding sections of said source leads are connected to said square tooth-recess profile section of said planar source extension lead, and said first and said second drain protruding sections of said drain leads are connected to said square tooth-recess profile section of said planar drain extension lead.

2. The power MOS transistor according to claim 1, wherein said first and said second sets of source leads and said first and said second sets of drain leads of said first and said second power MOS blocks are formed simultaneously during the same fabrication process in a first metallic layer; and said planar source extension lead and said planar drain extension lead are formed simultaneously during the same fabrication process in a second metallic layer.

* * * * *